United States Patent
Morita et al.

(10) Patent No.: US 10,546,526 B2
(45) Date of Patent: Jan. 28, 2020

(54) DISPLAY DEVICE

(71) Applicant: Japan Display Inc., Tokyo (JP)

(72) Inventors: Tetsuo Morita, Tokyo (JP); Hiroyuki Kimura, Tokyo (JP); Makoto Shibusawa, Tokyo (JP); Hiroshi Tabatake, Tokyo (JP); Yasuhiro Ogawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 121 days.

(21) Appl. No.: 15/633,960

(22) Filed: Jun. 27, 2017

(65) Prior Publication Data

US 2018/0374415 A1     Dec. 27, 2018

(30) Foreign Application Priority Data

Jul. 20, 2016 (JP) .................................. 2016-142153

(51) Int. Cl.
| | | |
|---|---|---|
| *G09G 3/3225* | (2016.01) | |
| *H01L 27/32* | (2006.01) | |
| *H01L 27/12* | (2006.01) | |
| *H01L 29/786* | (2006.01) | |

(52) U.S. Cl.
CPC ....... *G09G 3/3225* (2013.01); *H01L 27/1225* (2013.01); *H01L 27/3262* (2013.01); *H01L 29/7869* (2013.01); *H01L 29/78672* (2013.01); *G09G 2300/0842* (2013.01); *G09G 2310/0291* (2013.01); *G09G 2310/08* (2013.01)

(58) Field of Classification Search
None
See application file for complete search history.

(56) References Cited

U.S. PATENT DOCUMENTS

| | | | |
|---|---|---|---|
| 2010/0182223 A1 | 7/2010 | Choi et al. | |
| 2011/0193832 A1* | 8/2011 | Hirabayashi | .......... G02F 1/1368 |
| | | | 345/204 |
| 2017/0125452 A1* | 5/2017 | Ide | ........................ G02F 1/1368 |
| 2018/0005572 A1* | 1/2018 | Ka | ........................ G09G 3/3233 |
| 2018/0158842 A1* | 6/2018 | Lius | .................... H01L 27/1251 |

FOREIGN PATENT DOCUMENTS

| | | | |
|---|---|---|---|
| JP | 2014124185 | * | 6/2014 |
| JP | 2015-225104 A | | 12/2015 |
| KR | 1020160083498 | * | 7/2016 |
| WO | 20151031037 A1 | | 3/2015 |

* cited by examiner

*Primary Examiner* — Ifedayo B Iluyomade
(74) *Attorney, Agent, or Firm* — Michael Best & Friedrich LLP

(57) ABSTRACT

A display device includes a pixel region having a plurality of pixel and a driver circuit outside the pixel region. The pixels have a driving transistor and a switching transistor having a gate and a pair of terminals, a light-emitting element having an input terminal, and a storage capacitor having a pair of terminals. One terminal of the switching transistor is electrically connected to the gate of the driving transistor and one terminal of the storage capacitor. One terminal of the driving transistor is electrically connected to the other terminal of the storage capacitor and the input terminal. The driver circuit includes first and second transistors having a gate and a pair of terminal. The other terminal of the switching transistor is electrically connected to one terminal of the first transistor and one terminal of the second transistor. The second transistor has a channel region including an oxide semiconductor.

11 Claims, 15 Drawing Sheets

DISPLAY DEVICE

CROSS REFERENCE TO RELATED APPLICATIONS

This application is based on and claims the benefit of priority from the prior Japanese Patent Application No. 2016-142153, filed on Jul. 20, 2016, the entire contents of which are incorporated herein by reference.

FIELD

The present invention relates to a pixel circuit or a display device including the pixel circuit. For instance, the present invention relates to a pixel circuit including a light-emitting element structured with an organic electroluminescent (hereinafter, referred to as an organic EL) material or a display device having the pixel circuit.

BACKGROUND

Group 14 elements such as silicon and germanium are represented as a typical example exhibiting semiconductor properties. Particularly, silicon is utilized in almost all of the semiconductor devices typified by a display device due to its wide availability, easiness in processing, excellent semiconductor properties, easiness in controlling properties, and the like. Similar to silicon, an oxide exemplified by an oxide of Group 13 element such as indium and gallium also shows semiconductor properties and can be used in a semiconductor element such as a transistor. For example, as disclosed in the Japanese Patent Application Publication No. 2015-225104, International Patent Application Publication No. 2015-031037, and US Patent Application Publication 2010/0182223, semiconductor devices and display devices utilizing the semiconductor devices to which a transistor having a semiconductor including silicon (hereinafter, referred to as a silicon semiconductor) and a transistor including an oxide semiconductor are installed have been developed.

SUMMARY

An embodiment of the present invention is a display device including a pixel region having a plurality of pixel, and a driver circuit outside the pixel region. At least one of the plurality of pixels possesses a driving transistor having a gate and a pair of terminals, a switching transistor having a gate and a pair of terminals, a light-emitting element having an input terminal and an output terminal, and a storage capacitor having a pair of terminals. One terminal of the switching transistor is electrically connected to the gate of the driving transistor and one terminal of the storage capacitor. One terminal of the driving transistor is electrically connected to the other terminal of the storage capacitor and the input terminal. The driver circuit includes a first transistor and a second transistor each having a gate and a pair of terminals. The other terminal of the switching transistor is electrically connected to one terminal of the first transistor and one terminal of the second transistor. The second transistor has a channel region including an oxide semiconductor.

An embodiment of the present invention is a display device including a pixel over a substrate, and a driver circuit located over the substrate and including a buffer having a first transistor and a second transistor. The first transistor and the second transistor each have a gate and a pair of terminals. One terminal of the first transistor is electrically connected to one terminal of the second transistor and the pixel. The first transistor has a channel region including silicon, and the second transistor has a channel region including an oxide semiconductor.

An embodiment of the present invention is a display device including a pixel located over a substrate and having a switching transistor, and a driver circuit located over the substrate and having an analogue circuit including a first transistor and a second transistor. The first transistor and the second transistor each have a gate and a pair of terminals. One terminal of the first transistor is electrically connected to one terminal of the second transistor and the pixel. The other terminal of the second transistor is configured to be applied with a signal which activates the switching transistor. The first transistor has a channel region including silicon, and the second transistor has a channel region including an oxide semiconductor.

DESCRIPTION OF EMBODIMENTS

Hereinafter, the embodiments of the present invention are explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present invention, when a plurality of films is formed by processing one film, the plurality of films may have functions or rules different from each other. However, the plurality of films originates from a film which is formed as the same layer in the same process. Therefore, the plurality of films is defined as films existing in the same layer.

In the specification and the claims, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

<First Embodiment>

In the present embodiment, a pixel circuit according to an embodiment of the present invention and a structure of a display device including the pixel circuit are explained by using FIG. 1 to FIG. 4B.

1. Outline Structure

Figure 1:
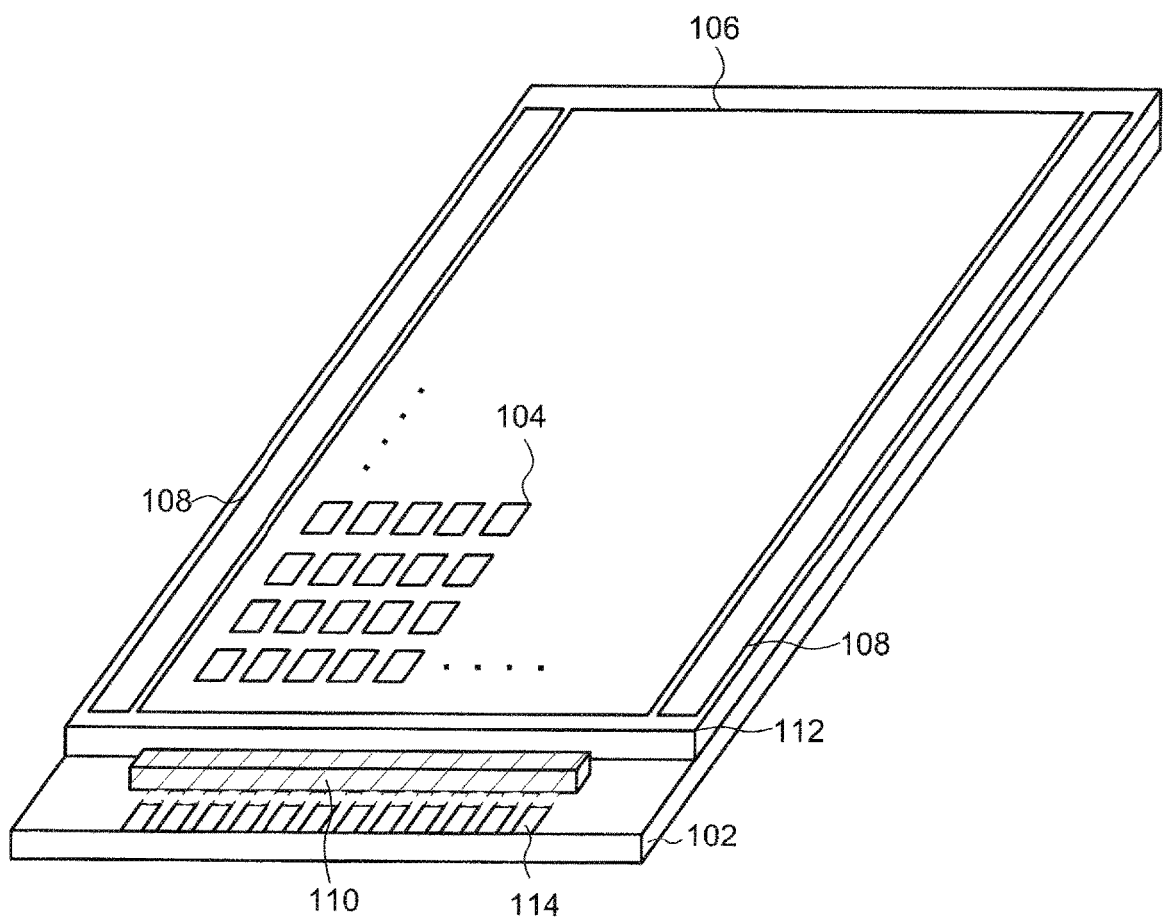
FIG. 1 is a schematic perspective view of a display device according to an embodiment of the present invention.

A schematically illustrated perspective view of a display device 100 according to the present embodiment is shown in FIG. 1. The display device 100 has, over one surface (top surface) of a substrate 102, a pixel region 106 including a plurality of pixels 104 arranged in a row direction and a column direction, scanning-line driver circuits 108, and a data-line driver circuit 110. The scanning-line driver circuits 108 and the data-line driver circuit 110 are located outside the pixel region 106. The pixel region 106 and the scanning-line driver circuits 108 are disposed between the substrate 102 and an opposing substrate 112. Wirings extend from the pixel region 106 to an edge portion of the substrate 102 and are exposed at the edge portion of the substrate 102 to form terminals 114. The terminals 114 are connected to a connector (not illustrated) such as a flexible printed circuit (FPC). Image signals supplied from an external circuit (not illustrated) are provided to the pixels 104 through the scanning-line driver circuits 108 and the data-line driver circuit 110 to control display elements in the pixels 104, thereby reproducing an image on the pixel region 106. In the present embodiment, two scanning-line driver circuits 108 are arranged so as to sandwich the pixel region 106. However, a single scanning-line driver circuit 108 may be provided. Additionally, the scanning-line driver circuits 108 and the data-line driver circuit 110 may not be directly formed over the substrate 102, and a driver circuit fabricated over anther substrate may be mounted over the substrate 102 or the connector.

Display elements such as light-emitting elements or liquid crystal elements providing colors different from one another may be formed in the plurality of pixels 104, by which full-color display can be achieved. For example, display elements giving red, green, and blue colors may be respectively arranged in three pixels 104. Alternatively, a display element giving white color is used in all of the pixels 104, and red, green, or blue colors are extracted from the respective pixels 104 by using a color filter, thereby performing full-color display. Colors finally extracted are not limited to a combination of red, green, and blue colors. For example, four kinds of colors of red, green, blue, and white may be respectively extracted from four pixels 104. There is also no limitation to an arrangement of the pixels 104, and a stripe arrangement, a delta arrangement, a Pentile arrangement, and the like can be employed.

Figure 2:
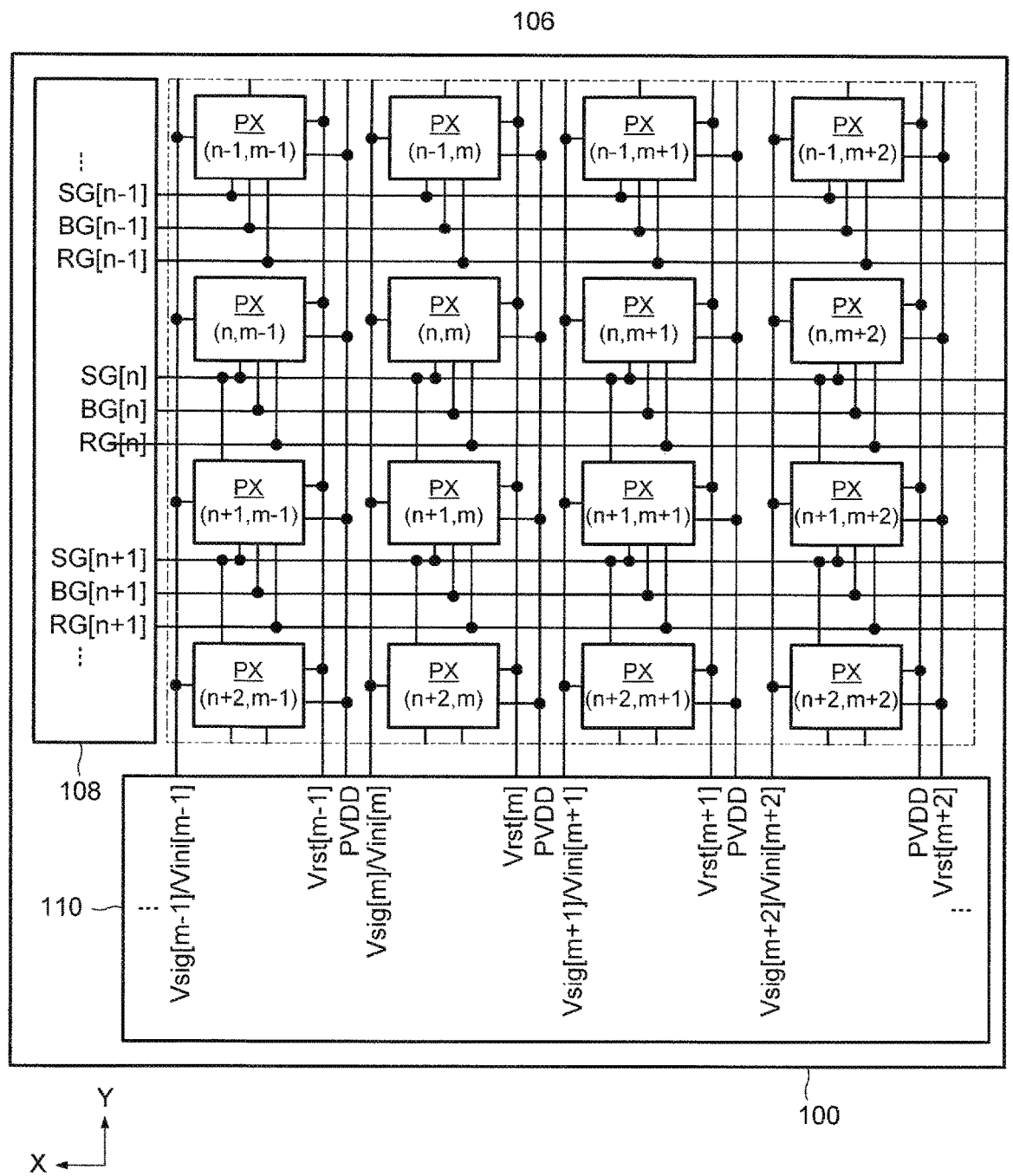
FIG. 2 is a drawing showing a schematic structure of a display device according to an embodiment of the present invention.

As shown in FIG. 2, a plurality of pixel circuits PX is arranged in a matrix form in the pixel region 106, and a variety of wirings is arranged from the scanning-line driver circuit 108 and the data-line driver circuit 110 in a X direction and a Y direction perpendicularly intersecting each other. Each pixel 104 has the pixel circuit PX. Hereinafter, explanation is given for the case where the matrix is a square array with N rows and M columns.

As described below, a light-emitting element OLED is arranged as a display element in each pixel circuit PX. The scanning-line driver circuit 108 and the data-line driver circuit 110 have a role to form an image by driving the light-emitting element OLED in each pixel circuit PX to emit light.

Specifically, the scanning-line driver circuit 108 is configured to commonly supply control signals SG[n], BG[n], and RG[n] to the plurality of pixel circuits PX located in the nth row of the matrix formed in the pixel region 106. n is an integer from 1 to N (the number of the rows of the matrix).

The data-line driver circuit 110 is configured to commonly supply an image signal Vsig[m] and a reset signal Vrst[m] to the plurality of pixel circuits PX located in the mth column of the matrix formed in the pixel region 106. m is an integer from 1 to M (the number of columns of the matrix). Note that [n] and [m] are each a symbol showing that the corresponding structures are located in the nth row and mth column. However, when the corresponding row and column are not necessary to be specified, the symbols [n] and [m] may be omitted.

The data-line driver circuit 110 is further configured to supply both image signal Vsig[m] and initialization signal Vini[m]. In the following explanation, potentials of the image signal Vsig[m], the initialization signal Vini[m], and the reset signal Vrst[m] may be expressed by Vsig[m], Vini[m], and Vrst[m], respectively. This expression manner is similarly applied to other signals.

The data-line driver circuit 110 is further configured to supply a power-source potential PVDD to each pixel circuit PX through a high-potential power-source line. Although not shown in FIG. 2, a common electrode commonly provided to the pixel circuits PX is arranged in the pixel region 106, and the data-line driver circuit 110 is configured to supply a ground potential PVSS to the common electrode.

2. Structure of Pixel

Figure 3A:
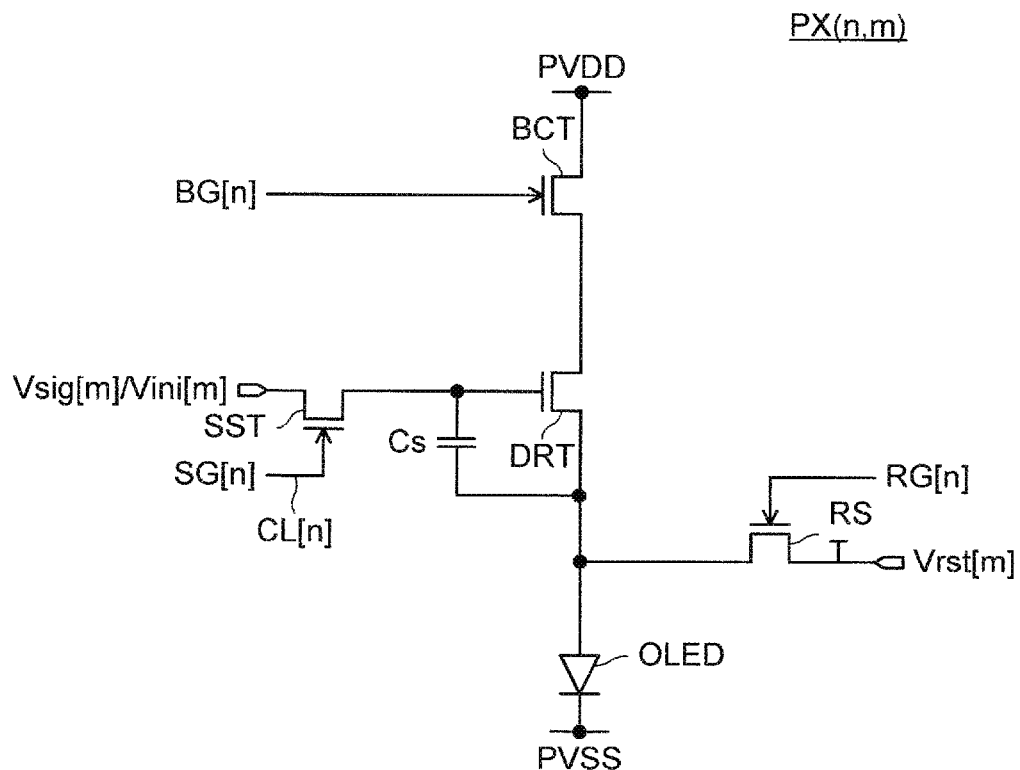
FIG. 3A and FIG. 3B are respectively an equivalent circuit of a pixel of a display device according to an embodiment of the present invention and a timing chart of each signal.

FIG. 3A is an equivalent circuit of the pixel circuit X shown in FIG. 2. In this figure, the pixel circuit PX(n, m) located in the nth row and mth column of the matrix formed in the pixel region 106 is shown. The structures of other pixels PX are the same as that of the pixel circuit PX(n, m).

As shown in FIG. 3A, the pixel circuit PX(n m) is configured to have a driving transistor DRT, a pixel transistor SST (control transistor or switching transistor in this embodiment), a reset transistor RST, an output transistor BCT, and a storage capacitor Cs in addition to the light-emitting element OLED. These transistors each have a gate and a pair of terminals, and the storage capacitor has a pair of terminals.

One terminal of the driving transistor DRT is connected, through the output transistor BCT, to the high-potential power-source line supplied with the power-source potential PVDD. The other terminal of the driving transistor DRT is connected to an input terminal (anode) of the light-emitting element OLED. An output terminal (cathode) of the light-emitting element OLED is connected to the common electrode supplied with the ground potential PVSS. The input terminal of the light-emitting element OLED is also connected to an input terminal of the reset signal Vrst[m] through the reset transistor RST.

The gate of the driving transistor DRT is connected to an input terminal of the image signal Vsig[m] (and the initialization signal Vini[m]) through the pixel transistor SST and also connected to one terminal of the storage capacitor Cs. The other terminal of the storage capacitor Cs is connected to the other terminal of the driving transistor DRT.

The gate of the pixel transistor SST is supplied with the control signal SG[n] through a control line CL[n] provided between the scanning-line driver circuit 108 and each pixel circuit PX(n, m) shown in FIG. 2. The gate of the output transistor BCT is supplied with the control signal BG[n], and the gate of the reset transistor RST is supplied with the control signal RG[n].

The driving transistor DRT, the pixel transistor SST, the reset transistor RST, and the output transistor BCT each have a semiconductor film in which a channel region is formed, and each semiconductor film may include a variety of semiconductor materials. Group 14 elements such as silicon and germanium are represented as a semiconductor material. Alternatively, an oxide semiconductor may be used as a semiconductor material. An oxide semiconductor can be selected from Group 13 elements such as indium and gallium. When an oxide semiconductor is employed, the semiconductor films may contain different Group 13 elements and may possess indium-gallium oxide (IGO), for example. The semiconductor films may further contain Group 12 elements and may include indium-gallium-zinc oxide (IGZO) as an example. The semiconductor films may further contain another element and may include tin of Group 14 elements, titanium or zirconium of Group 4 elements, or the like. Hereinafter, a semiconductor film containing silicon as a main component is referred to as a silicon semiconductor film, and a semiconductor film containing an oxide semiconductor as a main component is referred to as an oxide semiconductor film.

Crystallinity of the semiconductor films is not limited, and the semiconductor films may have a single-crystalline, a polycrystalline, a microcrystalline, or an amorphous morphology.

There is no limitation to the structures of the driving transistor DRT, the pixel transistor SST, the reset transistor RST, and the output transistor BCT, and a bottom-gate type transistor or a top-gate type transistor may be used. Alternatively, these transistors may have the gates over and under the semiconductor films. In the case of a top-gate type, a so-called self-aligned structure may be employed. In the case of a bottom-gate type, a so-called channel-etched structure may be used in which a thickness of the channel region in the semiconductor film is smaller than that covered by each terminal. Alternatively, the transistors may have a channel-stopped structurer in which an insulating film is provided between the semiconductor film and the pair of terminals.

3. Buffer

Figure 4A:
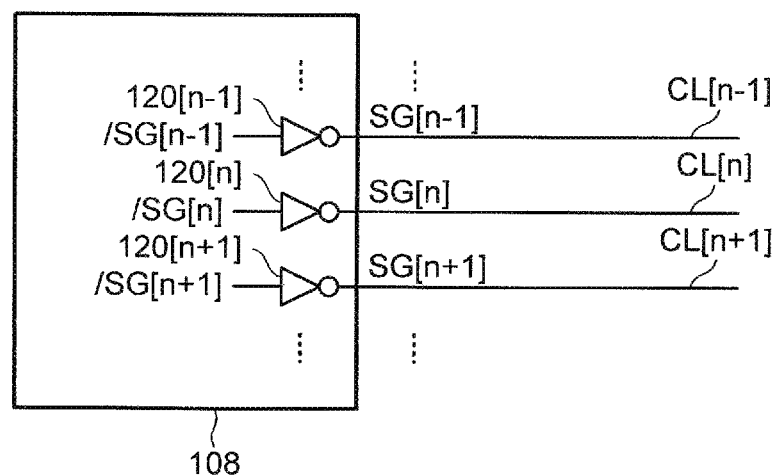
FIG. 4A and FIG. 4B are respectively a schematic drawing of a buffer of a display device according to an embodiment of the present invention and an equivalent circuit thereof.
Figure 4B:
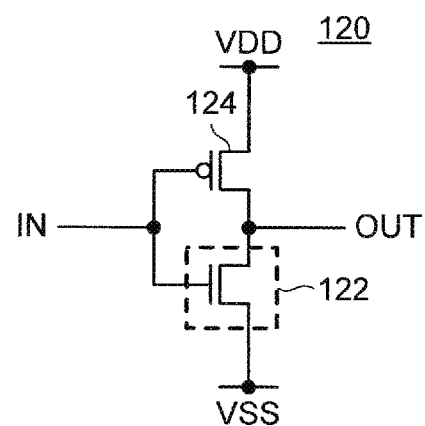

As shown in FIG. 4A, the display device 100 of the present embodiment has buffers 120 in the scanning-line driver circuit 108 shown in FIG. 2. The control line CL[n] supplied with the control signal SG[n] is connected to the buffer 120[$n$] in the scanning-line driver circuit 108. The buffer 120[$n$] is a circuit located at a final stage of a circuit portion generating the control signal SG[n] in the scanning-line driver circuit 108. As shown in an equivalent circuit of FIG. 4B, the buffer 120[$n$] has a structure in which an n-channel type transistor 122 (second transistor) and a p-channel type transistor 124 (first transistor) are connected in series between the high-potential power-source line supplied with the power-source potential VDD (first power-source potential) and the low-potential power-source line supplied with the ground potential VSS (a second power-source potential lower than the first power-source potential). Gates of the p-channel type transistor 124 and the n-channel type transistor 122 are connected to each other to form an input IN of the buffer 120[$n$]. An inverted signal/SG[n] (a signal corresponding to the control signal SG[n]) of the control signal SG[n] is supplied to the input IN from an internal circuit (not illustrated) of the scanning-driver circuit 108. Moreover, an output OUT of the buffer 120[$n$] is obtained from a connection point of one terminal of the p-channel type transistor 124 and the n-channel type transistor 122. The output OUT is commonly connected to the gates of the pixel transistors SST of the pixel circuit PX(n, 1) to the pixel circuit PX(n, M) located in the nth row (see FIG. 3A).

As a semiconductor film including a channel region of the p-channel type transistor 124, a silicon semiconductor film can be used, for example. The silicon semiconductor film may include polysilicon, for example. On the other hand, as a semiconductor film including a channel region of the n-channel type transistor 122, the aforementioned oxide semiconductor film may be used. Note that the transistors 122 and 182 in which an oxide semiconductor film is used are surrounded by dotted boxes in FIG. 4B and FIG. 6A.

4. Driving Method

Figure 3B:
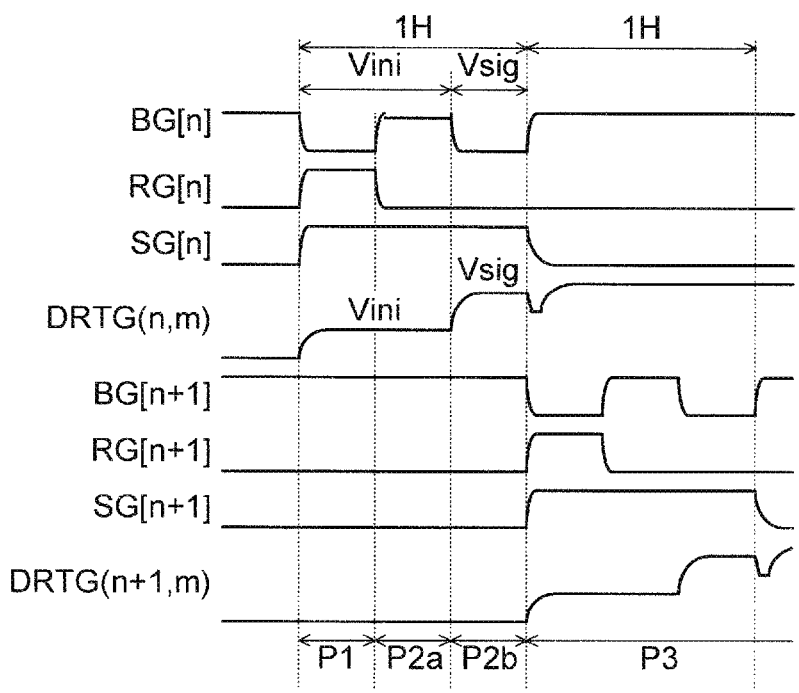

FIG. 3B is a timing chart showing the change with time of each signal shown in FIG. 3A. Hereinafter, operation of the pixel circuits PX is explained with reference to this figure. Note that the following explanation is given for the case where a high level corresponds to an active state. However, whether a high level or a low level is called an active state is arbitrarily determined for each signal. Moreover, a potential of the gate of the driving transistor DRT of the pixel circuit PX(n, m) is called a gate potential DRTG(n, m) in the following explanation.

As shown in FIG. 3B, the control signals BG[n], RG[n], and SG[n] are in an active state (high level), an inactive state (low level), and an inactive state (low level), respectively, in an initial state. When the operation enters a horizontal scanning period H for driving each pixel circuit PX in the nth row, the scanning-line driver circuit 108 simultaneously changes the states of the control signals BG[n], RG[n], and SG[n] to an inactive state, an active state, and an active state, respectively (reset period P1). At this time, the data-line driver circuit 110 supplies the initialization signal Vini[m]

instead of the image signal Vsig[m] to the input terminal of the image signal Vsig[m]. With this operation, the reset transistor RST and the pixel transistor SST become an on state and the output transistor BCT becomes an off state, by which the gate potential DRTG(n, m) and the potential difference between both terminals of the storage capacitor Cs are reset. The gate potential DRTG(n, m) becomes the same as the potential of the initialization signal Vini[m] after the reset operation.

Next, the scanning-line driver circuit 108 changes the states of the control signals BG[n] and RG[n] to an active state and an inactive state, respectively, while maintaining the state of the control signal SG[n] (threshold-compensation period P2a). The data-line driver circuit 110 continues supplying the initialization signal Vini[m]. With this operation, the output transistor BCT and the reset transistor RST are switched on and off, respectively, and supply of the power-source potential PVDD to one terminal of the driving transistor DRT is started. This threshold-compensation period P2a has a role to cancel variation of the gate potential DRTG(n, m) caused by threshold variation of the driving transistors DRT.

Next, the scanning-line driver circuit 108 changes the state of the control signal BG[n] to an inactive state while maintaining the states of the control signals RG[n] and SG[n] (writing period P2b). Furthermore, the data-line driver circuit 110 starts supplying the image signal Vsig[m] to the input terminal of the image signal Vsig[m]. With this operation, the output transistor BCT is switched off, and the gate potential DRTG(n, m) is changed to the potential of the image signal Vsig[m].

Finally, the initial states of the control signals BG[n], RG[n], and SG[n], that is, the active state, the inactive state, and the inactive state thereof are retrieved by the scanning-line driver circuit 108 (output period P3). At this time, the horizontal scanning period H corresponding to the nth row ends, and the scanning-line driver circuit 108 and the data-line driver circuit 110 start performing the same operation on each pixel PX in the next (n+1)th row.

In the pixel circuit PX(n, m) located in the nth row, the output transistor BCT becomes an on state, and the reset transistor RST and the pixel transistor SST become an on state at the time when the output period P3 starts, thereby supply of a current to the light-emitting element OLED is started. At this time, the gate potential DRTG(n, m) decreases for a moment, immediately increases again, and then stabilizes as shown in FIG. 3B due to a field-through voltage generated in the pixel transistor SST. Since the gate potential DRTG(n, m) after being stabilized is a potential corresponding to the image signal Vsig[m], the intensity of the current flowing to the light-emitting element OLED corresponds to the image signal Vsig[m]. As a result, the light-emitting element OLED emits light at a luminance corresponding to the image signal Vsig[m].

Variation in switching rate of the n-channel type transistor 122 causes variation in field-through voltage between the pixels 104, which leads to variation in emission luminance between the pixels 104 and results in a display defect such as observation of horizontal stripes. In the display device 100 according to the present embodiment, an oxide semiconductor can be used for a semiconductor film including the channel region of the n-channel type transistors 124 included in the buffers 120. A transistor including an oxide semiconductor in a channel region (hereinafter, referred to as an oxide-semiconductor transistor) exhibits smaller variation in electrical property compared with a transistor including silicon in a channel region (hereinafter, referred to as a silicon transistor), especially, a transistor including polysilicon in a channel region. Therefore, the switching rate can be made more uniformly than that of a silicon transistor. Reduction of variation in switching rate of the n-channel transistors 124 decreases a rate of the change from an off state to an on state of the control signal SG[n], which leads to reduction of the aforementioned variation in emission luminance. Additionally, an oxide-semiconductor transistor has a low switching rate compared with a silicon transistor. Hence, when the control signal SG[n] is inactivated at the time when the output period P3 is started, the voltage is slowly decreased, allowing a charge to be injected to the gate of the driving transistor DRT for a longer time. Accordingly, it is possible to decrease the field-through voltage and make the light-emitting element OLED to emit light at a luminance much closer to a luminance corresponding to the inputted image signal Vsig[m]. Therefore, the present embodiment enables reduction of the variation in emission luminance and production of a display device with high display quality.

<Second Embodiment>

In the present embodiment, a structure of the buffer 120 of the First Embodiment is explained. Note that the structure shown in this embodiment is merely an example, and the buffer 120 may have a structure other than the following structure. Description of the structures the same as or similar to those of the First Embodiment may be omitted.

Figure 5A:
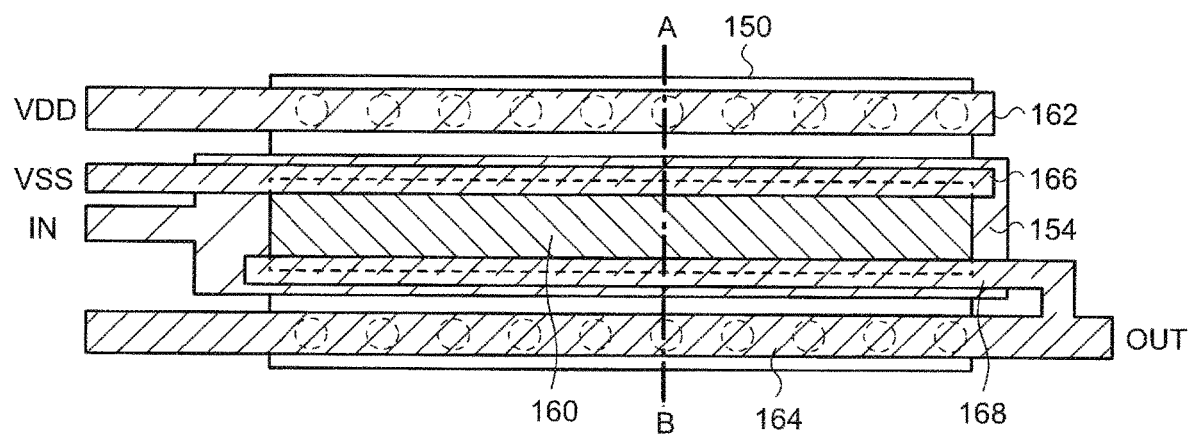
FIG. 5A and FIG. 5B are respectively a schematic top view and cross-sectional view of a buffer of a display device according to an embodiment of the present invention.
Figure 5B:
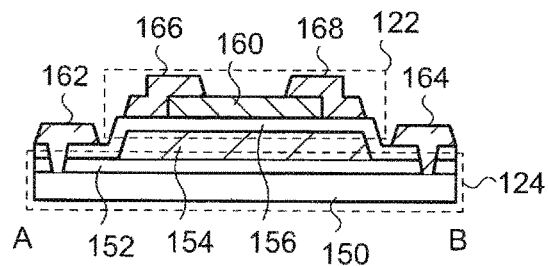

FIG. 5A is a schematic plane view of the buffer 120, and FIG. 5B is a cross-sectional view corresponding to a chain line A-B of FIG. 4A. As shown in FIG. 5B, the buffer 120 of the present embodiment possesses: a first semiconductor film 150 formed over the substrate 102 which is not illustrated; a first insulating film 152 over the first semiconductor film 150; a gate 154 located over the first insulating film 152 and overlapping with the first semiconductor film 150; a second insulating film 156 over the gate 154; a second semiconductor film 160 located over the second insulating film 156 and overlapping with the gate 154; a pair of terminals 162 and 164 located over the second insulating film 156 and electrically connected to the first semiconductor film 150; and a pair of terminals 166 and 168 located over the second semiconductor film 160 and electrically connected to the second semiconductor film 160. The first semiconductor film 150 can be a silicon semiconductor film, and the second semiconductor film 160 can be a silicon semiconductor film or an oxide-semiconductor film. The silicon semiconductor may contain polysilicon.

The first insulating film 152 and the second insulating film 156 may include a silicon-containing inorganic compound exemplified by silicon oxide, silicon nitride, silicon oxynitride, and silicon nitride oxide. When the second semiconductor film 160 includes an oxide semiconductor, the second insulating film 156 is preferred to include silicon oxide.

The p-channel type transistor 124 is constructed by the first semiconductor film 150, the first insulating film 152, the gate 154, and the pair of terminals 162 and 164. The first insulating film 152 functions as a gate insulating film of the p-channel type transistor 124. On the other hand, the n-channel type transistor 122 is constructed by the gate 154, the second insulating film 156, the second semiconductor film 160, and the pair of terminals 166 and 168. The second insulating film 156 functions as a gate insulating film of the n-channel type transistor 122. As described above, the n-channel type transistor 122 and the p-channel type transistor 124 are stacked in the buffer 120 exemplified in the present embodiment. The first semiconductor film 150, the gate 154, and the second semiconductor film 160 overlap with one another, and the gate 154 is shared by the p-channel type transistor 124 and the n-channel type transistor 122.

The terminals 164 and 168 are electrically connected to each other to form the output OUT of the buffer 120. The terminals 164 and 168 may be united (integrated) as shown in FIG. 5A or may be formed so as to exist in different layers and then electrically connected to each other. The terminal 162 is supplied with the power-source potential VDD from a power-source circuit which is not illustrated. The terminal 166 is supplied with the ground potential VSS from a power-source circuit which is not illustrated. The gate 154 structures the input IN shown in FIG. 4B.

As shown in FIG. 5A, the first semiconductor film 150 and the second semiconductor film 160 may be configured so that a channel width is larger than a channel length. This structure enables the n-channel type transistor 122 and the p-channel type transistor 124 to supply a voltage sufficient for driving the pixel circuits PX even if a field-effect mobility of the first semiconductor film 150 and the second semiconductor film 160 is low.

Note that a length of the gate 154 (a length in a channel-width direction) may be larger than those of the first semiconductor film 150 and the second semiconductor film 160. FIG. 5A is illustrated so that the entire bottom surface of the second semiconductor film 160 overlaps with the gate 154. However, the whole of the gate 154 may be covered by the second semiconductor film 160.

As described above, the stack of the p-channel type transistor 124 and the n-channel type transistor 122 enables reduction of an area occupied by the buffer 120 compared with the case where they are laterally arranged. Therefore, an area occupied by the scanning-driver circuit can be decreased, and a wide pixel region can be secured.

<Third Embodiment>

In the present embodiment, a structure is explained where an analogue switch 180 is provided instead of the buffer 120 of the Second Embodiment. Note that the structure shown in the present embodiment is merely an example, and the analogue switch 180 may have a structure other than the following structure. Description of the structures the same as or similar to those of the First and Second Embodiments may be omitted.

Figure 6A:
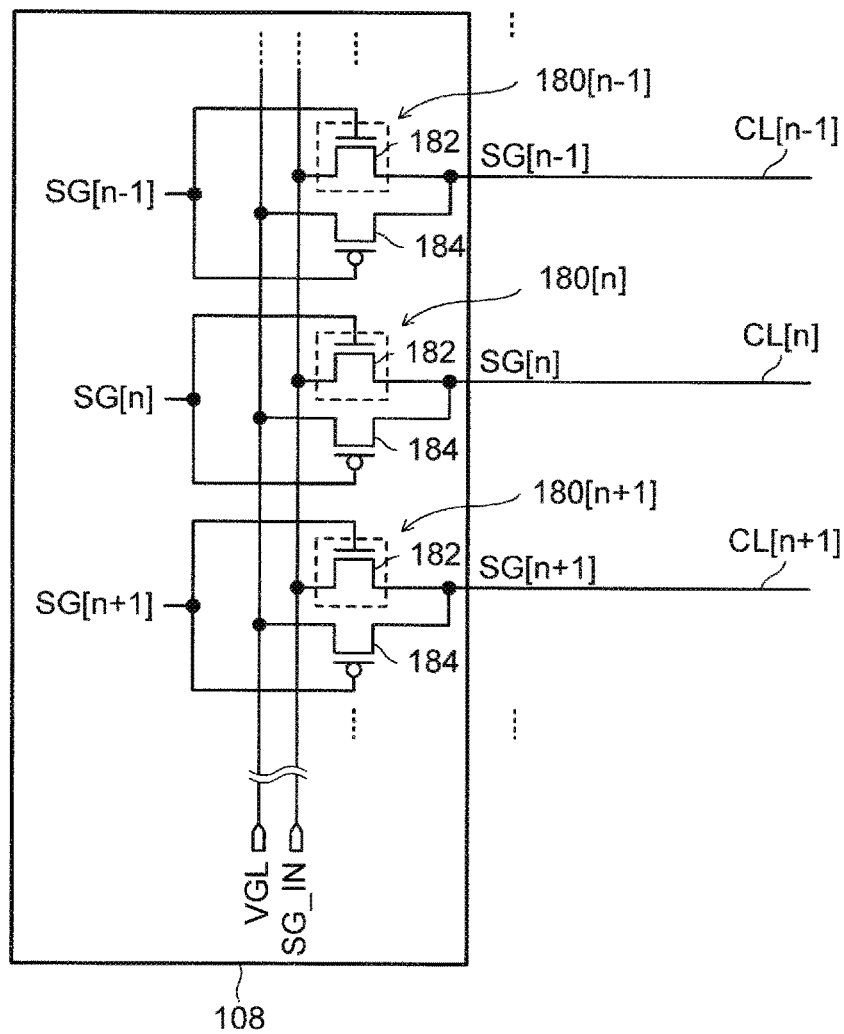
FIG. 6A and FIG. 6B are respectively an equivalent circuit of an analogue switch of a display device according to an embodiment of the present invention and a timing chart of each signal.

An equivalent circuit of the analogue switch 180 included in the scanning-line driver circuit 108 is shown in FIG. 6A. The analogue switch 180 is located at the final stage of the circuit portion generating the control signal SG in the scanning-line driver circuit 108. The analogue switch 180 possesses the n-channel type transistor 182 and the p-channel type transistor 184. The gates of the n-channel type transistor 182 and the p-channel type transistor 184 are electrically connected to each other and commonly supplied with the control signal SG[n] (a signal corresponding to the control signal SG[n]) from an internal circuit in the scanning-line driver circuit 108. One terminal of the n-channel type transistor 182 is supplied with an input signal SG_IN common to each row. One terminal of the p-channel type transistor 184 is supplied with a potential VGL common to each row. The other terminal of the n-channel type transistor 182 and the other terminal of the p-channel type transistor 184 are electrically connected to each other and further connected to the control line CL[n].

As a semiconductor film including the channel region of the p-channel type transistor 184, a silicon semiconductor film may be used, for example, and a silicon semiconductor film may include polysilicon. On the other hand, as a semiconductor film including the channel region of the n-channel type transistor 182, the aforementioned oxide-semiconductor film can be used.

Figure 6B:
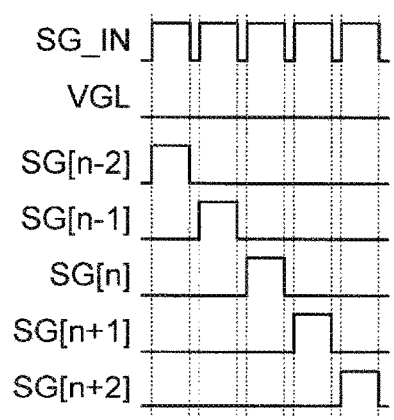

As shown in a timing chart of FIG. 6B, the input signal SG_IN is a signal which is activated to a high level at a timing when the control signal SG corresponding to each row is activated and actives the pixel transistor SST to lead to an on state. On the other hand, the potential VGL has a potential of the input signal SG_IN when the input signal SG_IN is in an inactivated state (low level). The scanning-line driver circuit 108 activates the signal commonly supplied to the gates of the n-channel type transistor 182 and the p-channel type transistor 184 at a timing when the pixel transistors SST is activated row-by-row and inactivates this signal when the corresponding row is not selected. With this operation, the control signal SG is sequentially activated one-by-one from n=1 to n=N as shown in FIG. 6B. This behavior is the same as the change of the control signal SG shown in FIG. 3B. Therefore, the display device 100 according to the present embodiment is able to undergo the same operation as that of the First Embodiment.

In the present embodiment, an oxide semiconductor can be employed in the channel region of the n-channel type transistor 182, and silicon (e.g., polysilicon) can be used in the channel region of the n-channel type transistor 184. With this structure, the rate variation of the change of the control signal SG[n] from on to off can be suppressed according to the principle the same as that of the First Embodiment, by which variation in emission luminance of the light-emitting element OLED can be reduced. Additionally, the field-through voltage can be decreased, allowing the light-emitting element OLED to emit light at a luminance much closer to a luminance corresponding to the image signal Vsig[m]. As a result, a display device with high display quality can be provided.

Note that the analogue switch 180[n] may have the same structure as that of the buffer 120[n] shown in FIG. 5A. Specifically, the terminal 162 is supplied with the input signal SG_IN instead of the power-source potential VDD, and the terminal 166 is supplied with the potential VGL instead of the ground potential VSS in the structure of FIG. 5A, by which the structure in FIG. 5A can be utilized as the analogue switch 180[n]. Similar to the Second Embodiment, this structure results in reduction of the area occupied by the analogue switch 180[n].

As explained above, the application of the present embodiment achieves reduction of variation in emission luminance and enables production of a display device providing high-quality display. Furthermore, the stack of the n-channel type transistor 182 and the p-channel type transistor 184 reduces the area occupied by the analogue switch 180 compared with the case where they are laterally arranged, by which a large pixel region 106 can be secured.

<Fourth Embodiment>

In the present embodiment, a display device 100 including a pixel circuit PX different from that of the First Embodiment is explained. Description of the structures the same as or similar to those of the First to Third Embodiment may be omitted.

Figure 7A:
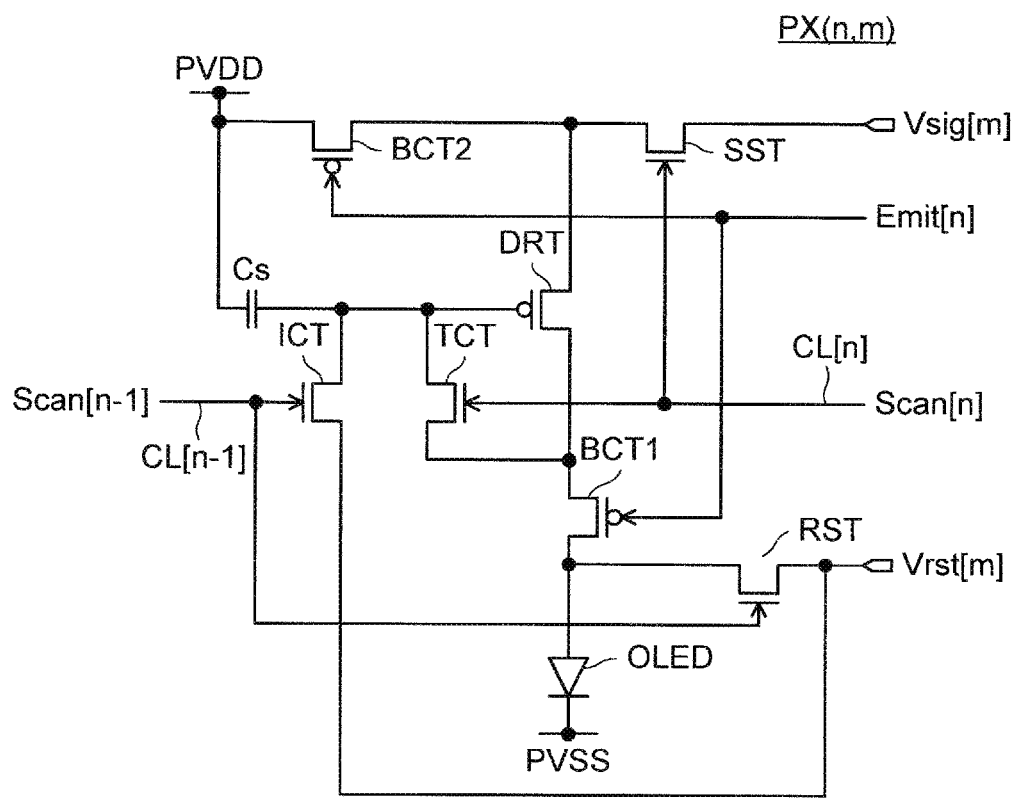
FIG. 7A and FIG. 7B are respectively an equivalent circuit of a pixel circuit of a display device according to an embodiment of the present invention and a timing chart of each signal.
Figure 7B:
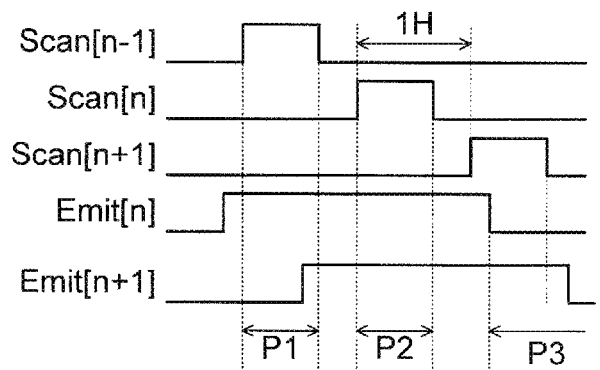

FIG. 7A is an equivalent circuit of the pixel circuit PX included in the display device 100 of the present embodiment, and FIG. 7B is a timing chart showing a change with time of each signal shown in FIG. 7A.

The pixel circuit PX of the display device 100 of the present embodiment is different from the display device 100 of the First Embodiment in that a p-channel type transistor is used for the driving transistor DRT. The equivalent circuit of the pixel circuit PX and the kind of the used signals are different from those of the First Embodiment due to this difference. The following explanation is given focusing on the difference from the First Embodiment.

The pixel circuit PX possesses the light-emitting element OLED, the pixel transistor SST, the reset transistor RST, a first output transistor BCT1, a second output transistor BCT2, a first switching transistor TCT (a control transistor or a switching transistor in the present embodiment), a second switching transistor ICT, and the storage capacitor in addition to the driving transistor DRT as a p-channel type transistor.

One terminal (source) of the driving transistor DRT is connected to the high-potential power-source line supplied with the power-source potential PVDD through the second output transistor BCT2. The other terminal (drain) of the driving transistor DRT is connected to the input terminal of the light-emitting element OLED through the first output transistor BCT1. The output terminal of the light-emitting element OLED is connected to the aforementioned common electrode supplied with the ground potential PVSS.

One terminal of the driving transistor DRT is also connected to the input terminal of the image signal Vsig[m] through the pixel transistor SST. Note that the initialization signal Vini[m] is not used in the present embodiment. The input terminal of the light-emitting element OLED is connected to the input terminal of the reset signal Vrst[m] through the reset transistor RST.

The first switching transistor TCT is connected between the gate and the other terminal of the driving transistor DRT. That is, one terminal of the first switching transistor TCT is connected to the gate of the driving transistor DRT, and the other terminal thereof is connected to the other terminal of the driving transistor DRT. The second switching transistor ICT is connected between the gate of the driving transistor DRT and the input terminal of the reset signal Vrst[m]. That is, one terminal of the second switching transistor ICT is connected to the gate of the driving transistor DRT, and the other terminal thereof is connected to the input terminal of the resent signal of Vrst[m].

The storage capacitor Cs is connected between the gate of the driving transistor DRT and the high-potential power-source line supplied with the power-source potential PVDD. That is, one terminal of the storage capacitor Cs is connected to the gate of the driving transistor DRT, and the other terminal is connected to the high-potential power-source line supplied with the power-source potential PVDD.

The driving transistor DRT, the pixel transistor SST, the reset transistor RST, the first output transistor BCT1, the second output transistor BCT2, the first switching transistor TCT, and the second switching transistor ICT each are a field-effect transistor having a channel region including silicon (e.g., polysilicon) or an oxide semiconductor. The driving transistor DRT, the first output transistor BCT1, and the second output transistor BCT2 are formed as a p-channel type transistor, whereas the pixel transistor SST, the reset transistor RST, the first switching transistor TCT, and the second switching transistor ICT are fabricated as a n-channel type transistor.

A gate of the first switching transistor TCT is supplied with a scanning signal Scan[n] through the control line CL[n]. The scanning signal Scan[n] is a signal supplied to each pixel circuit PX by the scanning-line driver circuit 108 instead of the control signals SG[n] and RG[n] of the First Embodiment and is also supplied to the gate of the pixel transistor SST. The scanning signal Scan[n−1] corresponding to the pixel circuit PX located in the (n−1)th row is supplied to each of a gate of the second switching transistor ICT and the gate of the reset transistor RST through the control line CL[n−1]. An emit signal Emit[n] is commonly supplied to gates of the first output transistor BCT1 and the second output transistor BCT2. The emit signal Emit[n] is a signal supplied to each pixel PX by the scanning-line driver circuit 108 instead of the control signal BG[n] of the First Embodiment.

As understood from FIG. 7B, the scanning signal Scan[n] is sequentially pulse-activated from n=1 to n=N with a predetermined interval of the horizontal scanning period H. Each activation period is shorter than the horizontal scanning period H. When focus is placed on the pixel circuit PX(n, m), the second switching transistor ICT and the reset transistor RST first become an on state by activating the scanning signal Scan[n−1] (reset period P1). At this time, the first switching transistor TCT and the pixel transistor SST each are in an off state because the scanning signal Scan[n] is in an inactivated state. Furthermore, the emit signal Emit[n] is activated before the scanning signal Scan[n−1] is activated and its activated state is maintained until the scanning signal Scan[n+1] is activated. Thus, the first output transistor BCT1 and the second output transistor BCT2 are also off in the reset period P1.

Thus, only the second switching transistor ICT and the reset transistor RST are on in the reset period P1, and the reset signal Vrst[m] is supplied to the gate of the driving transistor DRT. With this operation, the potential of the gate (gate potential) of the driving transistor DRT is reset to Vrst[m]. Additionally, the potential difference between the terminals of the storage capacitor Cs is reset to PVDD−Vrst[m].

Next, the scanning signal Scan[n] is activated by which the first switching transistor TCT becomes an on state (writing period P2). On the other hand, the second switching transistor ICT and the reset transistor RST are turned off because the scanning signal Scan[n−1] is in an inactivated state. The first output transistor BCT1 and the second output transistor BCT2 are off because the emit signal Emit[n] continuously maintains an activated state.

In the writing period P2, the image signal Vsig[m] is supplied to one terminal (source) of the driving transistor DRT, and the potentials of the gate and the other terminal (drain) of the driving transistor DRT become Vsig[m]−Vth(n, m). Vth(n, m) is a threshold voltage of the driving transistor DRT in the pixel circuit PX(n, m). At this time, the potential difference between the terminals of the storage capacitor Cs becomes PVDD−(Vsig[m]−Vth(n, m)).

Next, the emit signal Emit[n] is inactivated by which the first output transistor BCT1 and the second output transistor BCT2 are turned on (output period P3). Furthermore, the pixel transistor SST, the reset transistor RST, the first switching transistor TCT, and the second switching transistor ICT each are turned off. With this operation, the gate potential of the driving transistor DRT becomes substantially the same as Vsig[m] so that the influence of Vth(n, m) is canceled from the gate potential of the driving transistor DRT. Hence, intensity of a drain current of the driving transistor DRT becomes a value corresponding to Vsig[m], allowing the light-emitting element OLED to emit light at an intensity corresponding to Vsig[m]. With this operation, light emission at the intensity corresponding to the image signal Vsig[m] is realized.

In the pixel circuit PX(n+1, m) located in the subsequent row to the row of the pixel circuit PX(n, m), the gate potential of the driving transistor DRT is reset in the writing period P2 of the pixel circuit PX(n, m). Specifically, the scanning line Scan[n] is activated in the writing period P2 of the pixel circuit PX(n, m) so that the second switching transistor ICT and the reset transistor RST in the pixel circuit PX(n+1, m) are turned on. The first output transistor BCT1 and the second output transistor BCT2 in the pixel circuit PX(N+1, m) maintain an off state because the emit signal Emit[n+1] of the pixel circuit PX(n+1, m) is activated in the reset period P1 of the pixel circuit PX(n, m). With this operation, the gate potential of the driving transistor DRT and the potential difference between the terminals of the storage capacitor CS are reset to Vrst[m], and PVDD–Vrst[m], respectively, in the pixel circuit PX(n+1, m).

The scanning signal Scan[n] is inactivated prior to the output period P3 of the pixel circuit PX(n, m), and the scanning signal Scan[n+1] is sequentially activated. With this operation, the second switching transistor ICT and the reset transistor RST of the pixel circuit PX(n+1, m) are turned off, while the first switching transistor ICT and the pixel transistor SST are turned off so that writing to the pixel circuit PX(n+1, m) starts. At this time, in the pixel circuit PX(n+1, m), the image signal Vsig[m] is supplied to the source of the driving transistor DRT, by which the potentials of the gate and the drain of the driving transistor DRT become Vsig[m]–Vth(n+1, m), and the potential difference between the terminals of the storage capacitor Cs becomes PVDD–(Vsig[m]–Vth(n+1, m)). Here, Vth(n+1, m) is a threshold voltage of the driving transistor DRT of the pixel circuit PX(n+1, m). With these operations, writing to the pixel circuit PX(n+1, m) is carried out in the output period P3 of the pixel circuit PX(n, m).

After that, the scanning signal Scan[n+1] is inactivated, and then the emit signal Emit[n+1] is also inactivated. With this operation, the first switching transistor ICT and the pixel transistor SST are turned off, and the first output transistor BCT1 and the second output transistor BCT2 are turned on in the pixel circuit PX(n+1, m) so that the output period of the pixel circuit PX(n+1, m) starts. The gate potential of the driving transistor DRT in the pixel circuit PX(n+1, m) becomes equal to Vsig[m] to cancel the influence of the threshold voltage, and a drain current corresponding to Vsig[m] is supplied to the light-emitting element OLED through the driving transistor DRT in the pixel circuit PX(n+1, m).

In the present embodiment, variation in changing rate from on to off of the scanning signal Scan[n] may result in variation in emission luminance of the light-emitting element OLED according to the same principle as that of the First Embodiment. However, similar to the control signal SG[n] explained in the First to Third Embodiments, the scanning signal Scan[n] is supplied to each pixel circuit PX from the scanning-line driver circuit 108 through the buffer 120 shown in FIG. 4A to FIG. 5B or the analogue switch 180 shown in FIG. 6A. Furthermore, the channel region of the n-channel type transistor forming the buffer 120 or the analogue switch 180 for supplying the scanning signal Scan[n] may include an oxide semiconductor in the present embodiment. This feature enables reduction of variation in emission luminance similar to the aforementioned Embodiments. Additionally, the field-through voltage can be decreased, enabling the light-emitting element OLED to emit light at a luminance much closer to a luminance corresponding to the inputted image signal Vsig[m]. Moreover, the use of the stacked structure in the buffer 120 or the analogue switch 180 shown in FIG. 5A and FIG. 5B allows reduction of an area occupied by the buffer 120 or the analogue switch 180. Hence, application of the present embodiment makes it possible to produce a display device having a large pixel area and high display quality.

<Fifth Embodiment>

In the present embodiment, modified examples of the pixel circuit PX shown in the First and Fourth Embodiments are explained. Description of the structures the same as or similar to those of the First to Fourth Embodiments may be omitted.

Figure 8:
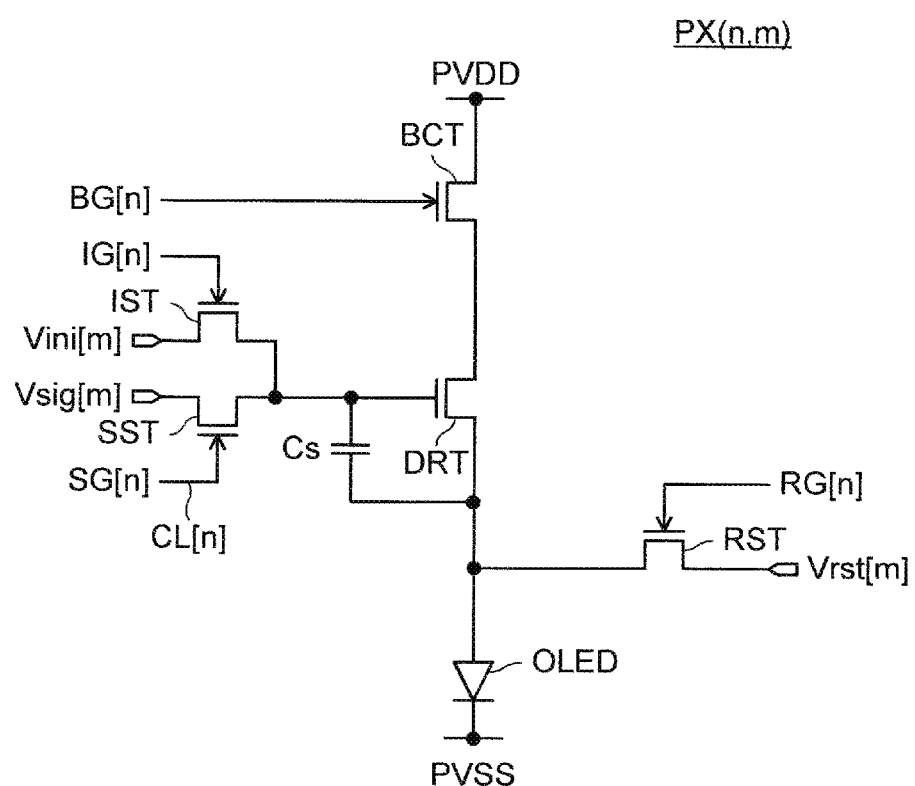
FIG. 8 is an equivalent circuit of a pixel circuit of a display device according to an embodiment of the present invention.
Figure 9:
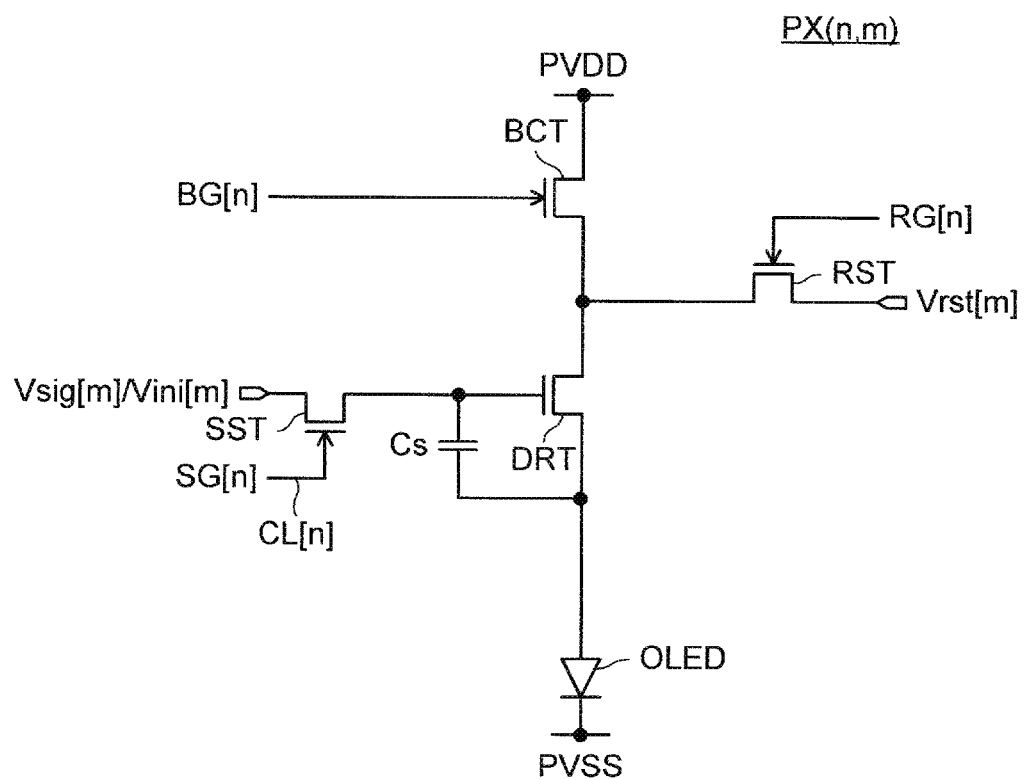
FIG. 9 is an equivalent circuit of a pixel circuit of a display device according to an embodiment of the present invention.
Figure 10:
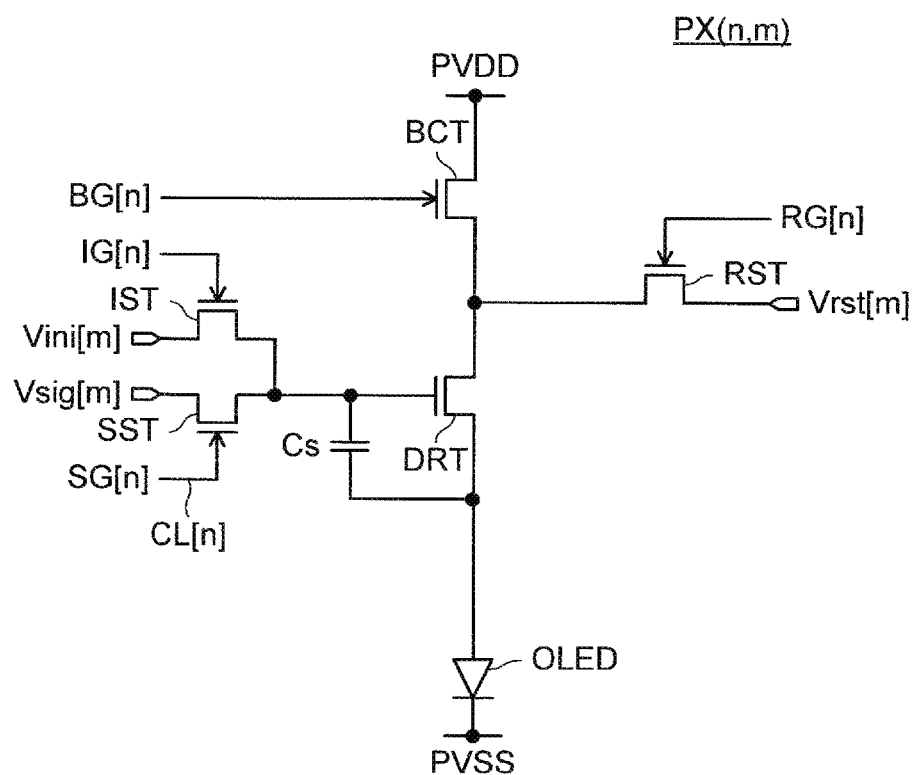
FIG. 10 is an equivalent circuit of a pixel circuit of a display device according to an embodiment of the present invention.

Equivalent circuits of the pixel circuits PX are shown in FIG. 8 to FIG. 10. These equivalent circuits are those obtained by partly modifying the pixel circuit PX of the First Embodiment shown in FIG. 3A.

Specifically, the pixel circuit PX shown in FIG. 8 is different from the pixel circuit PX shown in FIG. 3A in that the pixel transistor SST and an initialization transistor IST are provided in parallel. Similar to the pixel transistor SST, the initialization transistor IST may be a n-channel type field-effect transistor having a channel region including silicon such as polysilicon.

The date-line driver circuit 110 (FIG. 2) is configured so that the initialization signal Vini[m] is supplied to each pixel PX by using another wiring (not illustrated) different from the wiring for supplying the image signal Vsig[m]. One terminal of the initialization transistor IST is connected to an input terminal of this initialization signal Vini[m]. The other terminal of the initialization transistor IST is connected to the gate of the driving transistor DRT.

A control signal IG[n] is supplied to a gate of the initialization transistor IST from the scanning-line driver circuit 108. The control signal IG[n] is a signal which is activated in the period shown in FIG. 3B during which the initialization signal Vini[m] is supplied and is inactivated in the other period. The control signal SG[n] is a signal which is activated in the period shown in FIG. 3B during which the image signal Vsig[m] is supplied and is inactivated in the other period.

The pixel circuit PX in FIG. 9 is different from the pixel circuit PX shown in FIG. 3A in that one terminal of the reset transistor RST is not connected to the input terminal of the light-emitting element OLED but is connected to one terminal (the terminal on a side of the output transistor BCT) of the driving transistor DRT.

The pixel circuit PX in FIG. 10 is different from the pixel circuit PX shown in FIG. 8 in that one terminal of the reset transistor RST is not connected to the input terminal of the light-emitting element OLED but is connected to one terminal (the terminal on a side of the output transistor BCT) of the driving transistor DRT.

In the aforementioned modified examples, the buffer 120 or the analogue switch 180 shown in the First to Third Embodiments can be also used. Therefore, variation in changing rate from on to off of the control signal SG[n] can be reduced, and the light-emitting element OLED can emit light at a luminance much closer to a luminance corresponding to the image signal Vsig[m]. As a result, it is possible to produce a display device with high display quality. Additionally, the use of the stacked structure shown in FIG. 5A and FIG. 5B in the buffer 120 or the analogue switch 180 allows reduction of an area occupied by the buffer 120 or the analogue switch 180, enabling a large pixel region to be secured.

<Sixth Embodiment>

In the present embodiment, modified examples of the pixel circuit PX shown in the Fourth Embodiment are explained. Description of the structures the same as or similar to those of the First to Fifth Embodiments may be omitted.

Figure 11:
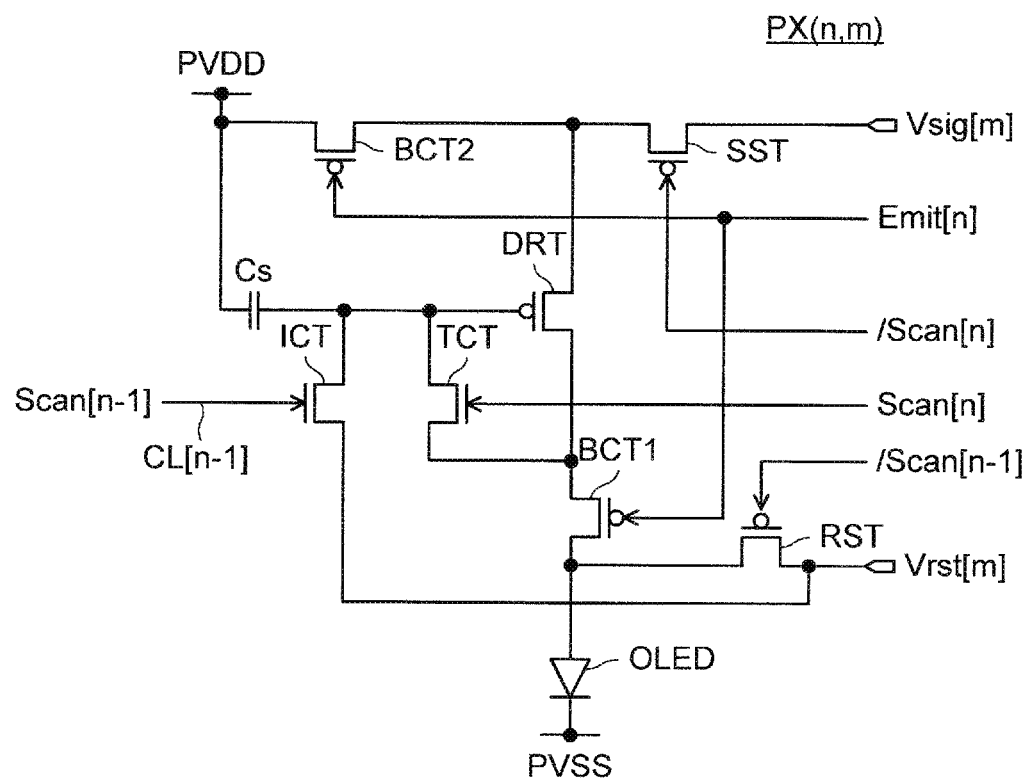
FIG. 11 is an equivalent circuit of a pixel circuit of a display device according to an embodiment of the present invention.
Figure 12A:
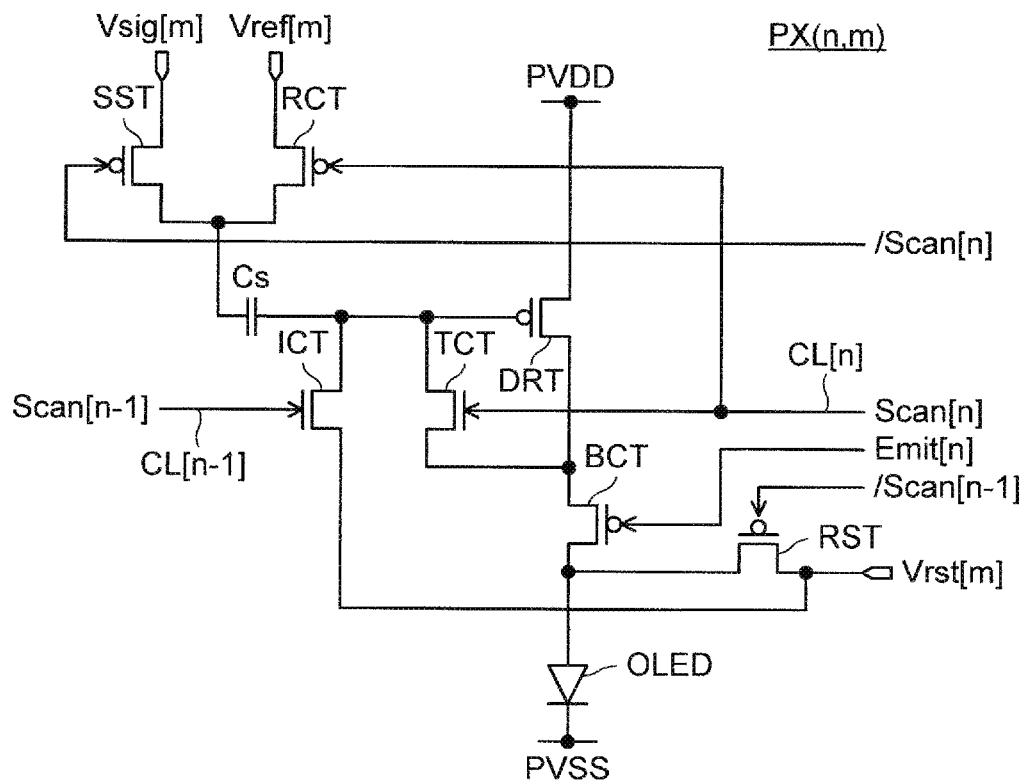
FIG. 12A and FIG. 12B are respectively an equivalent circuit of a pixel circuit of a display device according to an embodiment of the present invention and a timing chart thereof.
Figure 12B:
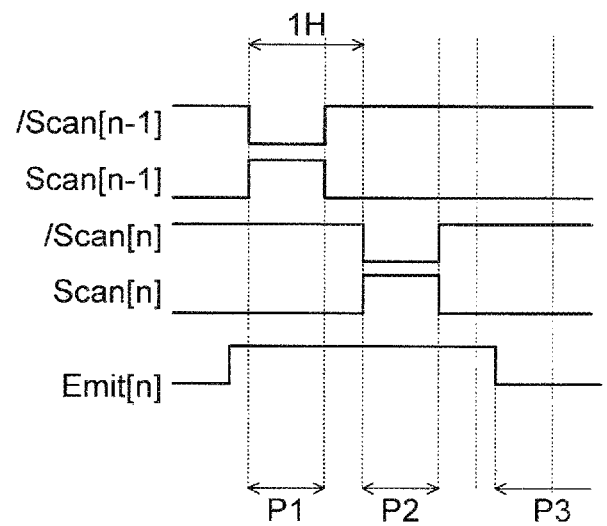
Figure 13:
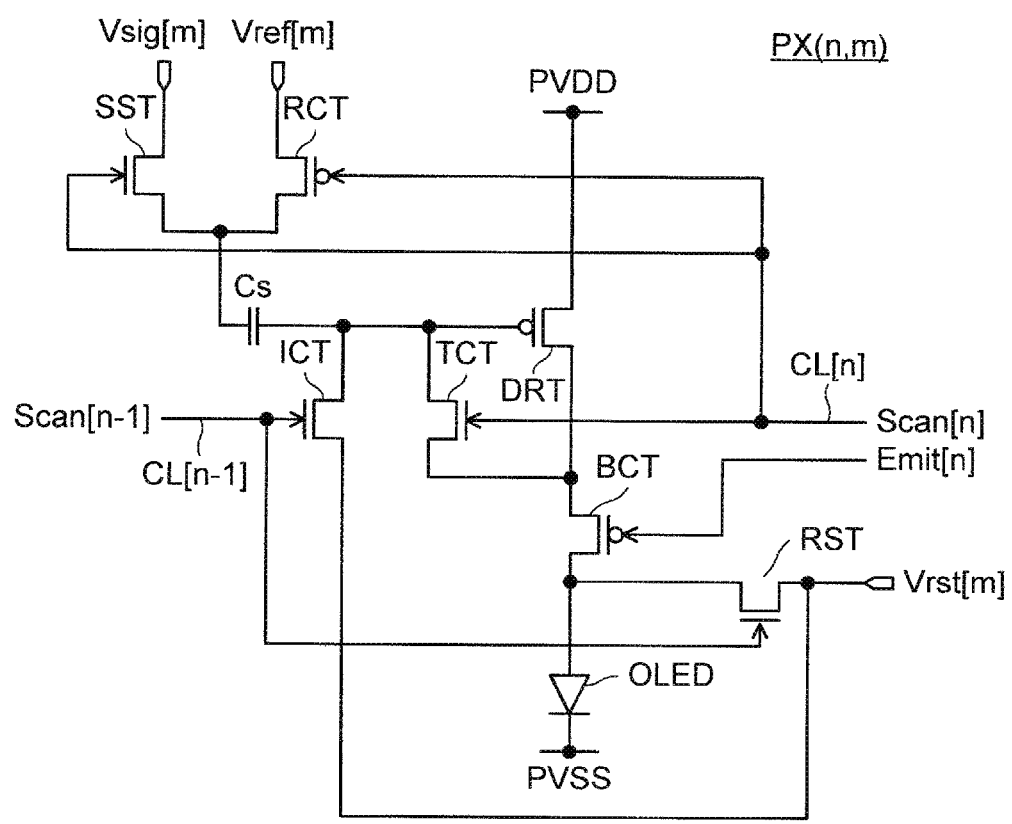
FIG. 13 is an equivalent circuit of a pixel circuit of a display device according to an embodiment of the present invention.

Equivalent circuits of the pixel circuits PX are shown in FIG. 11 to FIG. 13. The pixel circuit PX shown in FIG. 11 is different from the pixel circuit PX shown in FIG. 7A in that the reset transistor RST and the pixel transistor SST are p-channel type transistors, and the gate of the former and the gate of the latter are supplied with an inverted signal/Scan[n−1] of the scanning signal Scan[n−1] and an inverted signal/Scan[n] of the scanning signal Scan[n], respectively.

The pixel circuit PX shown in FIG. 12A is different from the pixel circuit PX shown in FIG. 11 in that the image signal Vsig[m] is input to the gate of the driving transistor DRT, the second output transistor BCT2 is not provided, and a reference transistor RCT is added.

One terminal of the driving transistor DRT is directly connected to the high-potential power-source line supplied with the power-source potential PVDD in the present embodiment. Furthermore, the other terminal of the storage capacitor Cs is not connected to the high-potential power-source line supplied with the power-source potential PVDD but is connected to one terminal of the pixel transistor SST and one terminal of the reference transistor RCT. The other terminal of the pixel transistor SST is connected to the input terminal of the image signal Vsig[m], and the other terminal of the reference transistor RCT is connected to an input terminal of a reference signal Vref[m]. Note that, similar to the image signal Vsig[m], the reference signal Vref[m] is a signal which is commonly supplied to the pixel circuits PX in the mth column from the data-line driver circuit 110 shown in FIG. 1.

Similar to the driving transistor DRT, the pixel transistor SST, the reset transistor RST, and the output transistor BCT, the reference transistor RCT may be a p-channel type field-effect transistor having a channel region including silicon such as polysilicon. The scanning signal Scan[n] is commonly supplied to a gate of the reference transistor RCT and the gate of the first switching transistor TCT.

Operation of the pixel circuit PX(n, m) of this modified example is explained by using a timing chart of each signal shown in FIG. 12B. As shown in FIG. 12B, the scanning signal Scan[n] and its inverted signal/Scan[n] are sequentially pulse-activated from n=1 to n=N with a predetermined interval of the horizontal scanning period.

First, the scanning signal Scan[n−1] and its inverted signal/Scan[n−1] of the preceding row is respectively activated and inactivated in the reset period P1 of the pixel PX(n, m). The activation of Scan[n−1] turns on the second switching transistor ICT, and the inactivation of the scanning signal/Scan[n−1] also turns on the reset transistor RST. The reference transistor RCT maintains an on state, and the first switching transistor TCT maintains an off state because the scanning signal Scan[n] is in an inactivated state prior to the reset period P1. To the contrary, the pixel transistor SST maintains an off state because the scanning signal/Scan[n] is in an activated state. Similarly, the output-transistor BCT maintains an off state because the emit signal Emit[n] is activated prior to the reset period P1.

Since the second switching transistor ICT, the reset transistor RST, and the reference transistor RCT are in an on state in the reset period P1, the gate of the driving transistor DRT and the anode of the light-emitting element are provided with Vrst[m] through the second switching transistor ICT and the reset transistor RCT so as to be reset. One terminal of the storage capacitor Cs is provided with Vrst[m] through the second switching transistor ICT, and the other terminal is provided with Vref[m] through the reference transistor RCT.

At the time when the reset period P1 is completed and the following writing period P2 is started, the scanning signal Scan[n−1] is inactivated, its inverted signal/Scan[n−1] is activate, Scan[n] is activated, and its inverted signal/Scan[n] is inactivated as shown in FIG. 12B. As a result, the second switching transistor ICT, the reset transistor RST, and the reference transistor RCT change to an off state, and the pixel transistor SST and the first switching transistor TCT change to an on state. The output transistor BCT maintains an off state because the emit signal Emit[n] keeps an activate state. Each of the potentials of the gate and the drain of the driving transistor DRT changes to PVDD−Vth(n, m) because the source of the driving transistor DRT is directly connected to the high-potential power-source line. On the other hand, Vsig[m] is supplied to the other terminal of the storage capacitor Cs. Therefore, the potential difference between the terminals of the storage capacitor Cs becomes Vsig−(PVDD−Vth(n, m)).

At the time when the writing period P2 is completed and the following output period P3 is started, the scanning signal Scan[n] is inactivated and its inverted signal/Scan[n] is activated as shown in FIG. 12B. As a result, the pixel transistor SST and the first switching transistor TCT change to an off state, while the reference transistor RCT and the output transistor BCT change to an on state. The other terminal of the storage capacitor Cs is electrically connected to the input terminal of the reference signal Vref and provided with Vref[m]. Since the potential difference Vsig−(PVDD−Vth(n, m)) between the terminals in the writing period P2 is maintained, the potential of one terminal of the storage capacitor Cs and the gate potential of the driving transistor DRT in the output period P3 become Vref−(Vsig−(PVDD−Vth(n, m))), i.e., Vref−Vsig+PVDD−Vth(n, m). Since the potential of the drain of the driving transistor DRT in the writing period P2 is PVDD−Vth(n, m), a voltage Vgs between the gate and the source of the driving transistor DRT in the output period P3 is (Vref−Vsig+PVDD−Vth(n, m))−(PVDD−Vth(n, m)), i.e., Vref−Vsig, and does not depend on Vth(n, m).

Thus, the driving transistor DRT can be driven at a voltage from which the threshold Vth(n, m) is canceled. Since the light-emitting element OLED can be driven with a current independent from Vth(n, m) in the absence of the influence of the variation in threshold voltage Vth(n, m), the variation in luminance between the pixel circuits PX(n, m) can be suppressed, and a high-quality image can be reproduced.

The pixel circuit PX according to a sixth modified example shown in FIG. 13 is different from the pixel circuit PX shown in FIG. 12A in that the reset transistor RST and the pixel transistor SST are n-channel type transistors, the gate of the former is supplied with the scanning signal Scan[n−1], and the gate of the latter is supplied with the scanning signal Scan[n].

Figure 14A:
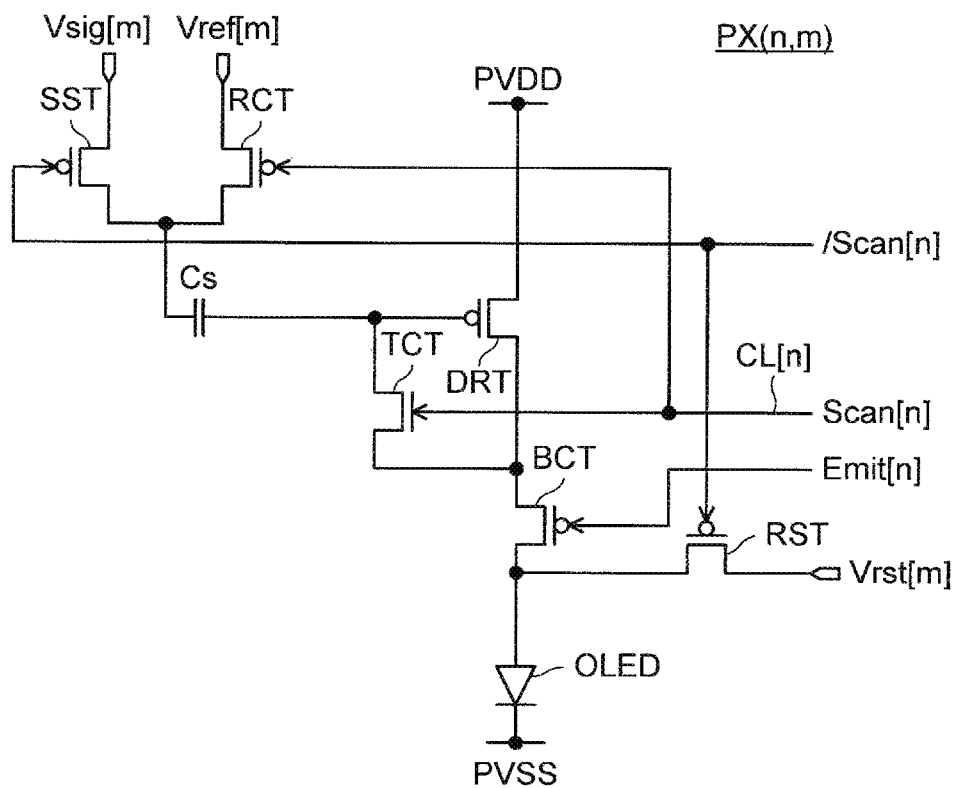
FIG. 14A and FIG. 14B are respectively an equivalent circuit of a pixel circuit of a display device according to an embodiment of the present invention and a timing chart thereof.

The pixel circuit PX shown in FIG. 14A is different from the pixel circuit PX shown in FIG. 13 in that the former does not have the second switching transistor ICT. Operation of this modified example is different from that of the pixel circuit PX shown in FIG. 12A in that the reset signal Vrst[m] is not supplied to the gate of the driving transistor DRT through the second switching transistor ICT but is supplied thereto through the reset transistor RST, the output transistor BCT, and the first switching transistor TCT in the reset period P1 (see FIG. 7B).

Figure 15:
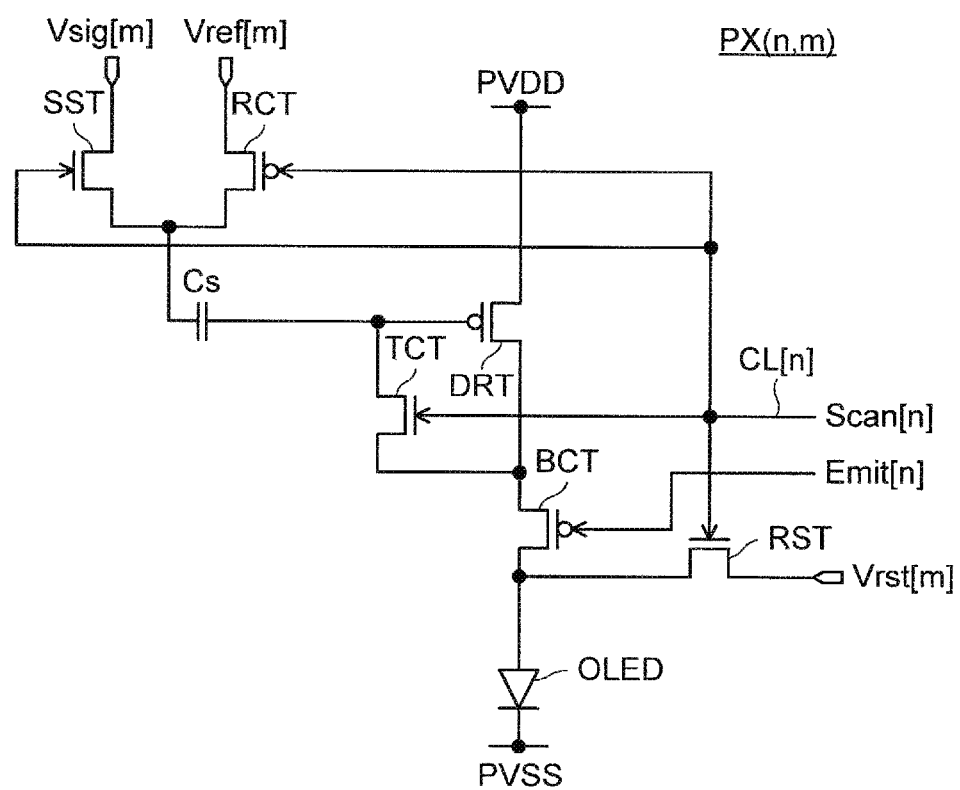
FIG. 15 is an equivalent circuit of a pixel circuit of a display device according to an embodiment of the present invention.

The pixel circuit PX shown in FIG. 15 is different from the pixel circuit PX shown in FIG. 7A in that the reset transistor RST and the pixel transistor SST are n-channel type transistors, and the scanning signal Scan[n] is supplied to their gates. Furthermore, the gate of the reset transistor RST and the gate of the second switching transistor ICT are connected to the input terminal of the reset signal Vrst[m], and the one terminal of the reset transistor RST and the other terminal of the switching transistor ICT are connected to the input terminal of the reference signal Vref[m].

Figure 14B:
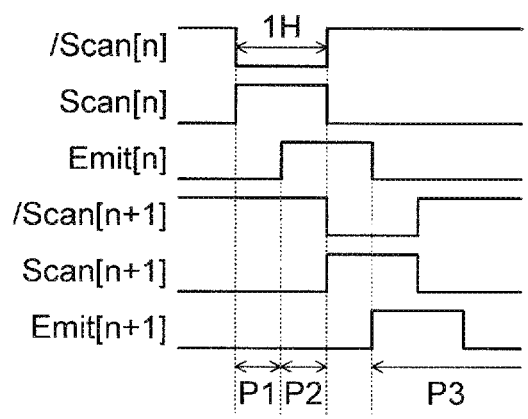

Operation of the pixel circuit PX of the present embodiment is explained by using the pixel circuit PX shown in FIG. 14A. A timing chart of the pixel circuit PX is shown in FIG. 14B. As shown in FIG. 14B, a period after the scanning signal Scan[n] is activated and until the emit signal Emit[n] is activated is the reset period P1, and a period after the emit signal Emit[n] is activated and until the scanning signal Scan[n] returns to an inactivated state is the writing period P2 in the pixel circuit shown in FIG. 14A.

In the reset period P1, since the driving transistor DRT and the reference transistor RCT become an off state, and the reset transistor RST, the output transistor BCT, the first switching transistor TCT, and the pixel transistor SST become an on state, the reset signal Vrst[m] is supplied to the gate of the driving transistor DRT and one terminal of the storage capacitor Cs. Simultaneously, Vsig[m] is provided to the other terminal of the storage capacitor Cs. With this operation, the gate potential of the driving transistor DRT and the potential difference between the terminals of the storage capacitor Cs are reset, and the potential difference between the terminals of the storage capacitor Cs becomes Vsig[m]−Vrst[m]. Here, when the potential of the reset signal Vrst[m] is 0 V, and the potential of the power-source potential PVDD is approximately 10 V, the potentials of the gate and the other terminal (drain) of the driving transistor DRT are determined by the potential difference therebetween. Hence, although the degree of the on state is not clearly determined, the driving transistor DRT is in an off state but exists in an on state to some extent or a state close to an on state.

In the writing period P2, the scanning signal Scan[n] and the inverted signal/Scan[n+1] of the scanning signal Scan[n+1] maintain an activated state, and the inverted signal/Scan[n] of the scanning signal Scan[n] and the scanning signal Scan[n+1] maintain an inactivate state, while the emit signal Emit[n] is activated. Therefore, the driving transistor DRT, the reference transistor RCT, and the output transistor BCT are turned off, and the reset transistor RST, the first switching transistor TCT, and the pixel transistor SST maintain an on state. The change of the output transistor BCT to an off state results in an increase of the potentials of the gate and the other terminal (drain) of the driving transistor DRT and one terminal of the storage capacitor Cs to PVDD−Vth(n, m). Hence, the potential difference between the terminals of the storage capacitor Cs becomes Vsig[m]−(PVDD−Vth(n, m)).

The scanning signal Scan[n] and the inverted signal/Scan[n+1] of the scanning signal Scan[n+1] are inactivated, while the inverted signal/Scan[n] of the scanning signal Scan[n] and the scanning signal Scan[n+1] are activated after the writing period P2 is completed and before the output period P3 is started. With this operation, the first switching transistor TCT, the pixel transistor SST, and the reset transistor RST are switched to an off state, and the reference transistor RCT is switched to an on state. As a result, the reference signal Vref[m] is supplied to the other terminal of the storage capacitor Cs. In the writing period P2 immediately before this period, the potential of the gate of the driving transistor DRT becomes PVDD−Vth(n, m), and the potential difference between the terminals of the storage capacitor Cs is maintained. Hence, the potential of the gate of the driving transistor DRT is changed to Vref[m]−(Vsig[m]−(PVDD−Vth(n, m)), i.e., Vref[m]−Vsig[m]+PVDD−Vth(n, m) due to coupling. On the other hand, since the first switching transistor TCT is in an off state, the potential of the other terminal (drain) of the driving transistor DRT is PVDD−Vth(n, m). Therefore, the potential difference between the gate and the other terminal (drain) of the driving transistor DRT becomes Vref[m]−Vsig[m] and does not include Vth(n, m). In other words, the potential difference between the gate and the other terminal (drain) of the driving transistor DRT does not depend on Vth(n, m).

In the following output period P3, the emit signal Emit[n] is inactivated, and the first switching transistor TCT is transformed to an on state. As a result, a current dependent on the potential difference Vref[m]−Vsig[m] between the gate and the other terminal (drain) flows in the driving transistor DRT, and this current is supplied to the light-emitting element OLED.

Thus, the driving transistor DRT can be driven with a voltage from which the threshold Vth(n, m) is canceled. Since the light-emitting element OLED can be driven with a current independent from Vth(n, m) without any influence of the variation in threshold Vth(n, m), the variation in luminance can be suppressed between the pixel circuits PX(n, m), and a high-quality image can be reproduced.

In the aforementioned modified examples, the buffer 120 or the analogue switch 180 shown in the First to Third Embodiments can be used. Therefore, it is possible to reduce the variation in changing rate of the control signal SG[n] from on to off, and the light-emitting element OLED can emit light at a luminance much closer to a luminance corresponding to the inputted image signal Vsig[m]. As a result, a display device with high display quality can be produced. Additionally, the application of the stacked structure shown in FIG. 5A and FIG. 5B to the buffer 120 or the analogue switch 180 reduces the area occupied by the buffer 120 or the analogue switch 180, thereby securing a large pixel region.

It is preferred that signal lines (type A) to be connected to the aforementioned buffer 120 or the analogue switch 180 be different from signal lines (type B) to be connected to a circuit in which the transistor surrounded by the dotted box in the aforementioned buffer 120 or the analogue switch 180 has a polysilicon semiconductor film. This is because the signal lines which require low influence of the field-through voltage in a change of the control signal from a high level to a low level are preferably different from the signal lines which are connected to a circuit utilizing polysilicon in order to reduce a frame area by decreasing an area of the circuit.

In the embodiment according to FIG. 3A and FIG. 3B, it is preferred that the control line transmitting the control signal SG[n] be the type A, while the control lines transmitting the control signals BG[n] and RG[n] be the type B. In the embodiment according to FIG. 7A and FIG. 7B, it is preferred that the control line CL[n] transmitting the scanning signal Scan[n] be the type A, while the control line CL[n−1] transmitting the scanning signal Scan[n−1] and the control line transmitting the emit signal Emit[n] be the type B. In the embodiments according to FIG. 8 to FIG. 10, it is preferred that the control line transmitting the control signal SG[n] be the type A, while the control lines transmitting other control signals IG[n], RG[n], and BG[n] be the type B. In the embodiments according to FIG. 11 to FIG. 13, it is preferred that the control line transmitting the scanning signal Scan[n] be the type A, while the control line transmitting the other scanning signal Scan[n−1], the control line transmitting the scanning signal/Scan[n], the control line transmitting the scanning signal/Scan[n−1], and the control line transmitting the emit signal Emit[n] be the type B.

In the embodiment according to FIG. 14A and FIG. 14B, it is preferred that the control line transmitting the scanning signal Scan[n] be the type A, while the control lines transmitting the other scanning signal/Scan[n] and the emit signal Emit[n] be the type B.

In the embodiment according to FIG. 15, it is preferred that the control line transmitting the scanning signal Scan[n] be the type A, while the control line transmitting the other emit signal Emit[n] be the type B.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by persons ordinarily skilled in the art.

What is claimed is:

1. A display device comprising: a pixel region comprising a plurality of pixels, at least one of the plurality of pixels including: a driving transistor having a gate and a pair of terminals; a switching transistor having a gate and a pair of terminals; a light-emitting element having an input terminal and an output terminal; and a storage capacitor having a pair of terminals; and a driver circuit outside the pixel region, wherein: one terminal of the switching transistor is directly connected to the gate of the driving transistor and one terminal of the storage capacitor; one terminal of the driving transistor is directly connected to the other terminal of the storage capacitor and the input terminal; the driver circuit comprises a first transistor and a second transistor each having a pair of terminals; the other terminal of the switching transistor is directly connected to one terminal of the first transistor and one terminal of the second transistor; the first transistor has a channel region; the second transistor has a channel region including an oxide semiconductor; the channel region of the second transistor overlaps with the channel region of the first transistor in a plan view, the first transistor comprises: a first semiconductor film, a first insulating film over the first semiconductor film, and a gate over the first insulating film, and the second transistor comprises: the gate of the first transistor, a second insulating film over the gate of the first transistor; and a second semiconductor film over the second insulating film.

2. The display device according to claim 1, wherein the gate of the first transistor and the gate of the second transistor are electrically connected to each other.

3. The display device according to claim 1, wherein the channel region of the first transistor includes silicon.

4. The display device according to claim 1, wherein the channel region of the first transistor includes polysilicon.

5. The display device according to claim 1,
wherein the other terminal of the first transistor is configured to be applied with a first potential, and
the other terminal of the second transistor is configured to be applied with a second potential lower than the first potential.

6. The display device according to claim 1,
wherein the other terminal of the first transistor is configured to be applied with a signal which activates the switching transistor.

7. The display device according to claim 1,
wherein the gate of the first transistor is shared by the first transistor and the second transistor.

8. A display device comprising: a pixel over a substrate, the pixel including a switching transistor; and a driver circuit over the substrate, the driver circuit comprising an analogue circuit including a first transistor and a second transistor, wherein: the first transistor and the second transistor each have a gate and a pair of terminals; one terminal of the first transistor is directly connected to one terminal of the second transistor and the pixel; the other terminal of the second transistor is configured to be applied with a signal which activates the switching transistor; the first transistor has a channel region including silicon; the second transistor has a channel region including an oxide semiconductor, the channel region of the second transistor overlaps with the channel region of the first transistor in a plan view, and a channel length of the second transistor is shorter than a channel length of the first transistor.

9. The display device according to claim 8,
wherein the first transistor comprises:
a first semiconductor film;
a first insulating film over the first semiconductor film; and
a gate over the first insulating film, and
the second transistor comprises:
the gate;
a second insulating film over the gate; and
a second semiconductor film over the second insulating film.

10. The display device according to claim 9,
wherein the gate is shared by the first transistor and the second transistor.

11. The display device according to claim 1, wherein a channel length of the second transistor is shorter than a channel length of the first transistor.

* * * * *